(12) United States Patent
Bollmann et al.

(10) Patent No.: US 8,124,897 B2
(45) Date of Patent: Feb. 28, 2012

(54) INPUT UNIT FOR ELECTROTECHNICAL DEVICES

(75) Inventors: Stefan Bollmann, Hamminkeln (DE); Achim Lerner, Borken (DE); Jens Rauber, Dortmund (DE)

(73) Assignee: Siemens Enterprise Communications GmbH & Co. KG, Munich (DE)

( * ) Notice: Subject to any disclaimer, the term of this patent is extended or adjusted under 35 U.S.C. 154(b) by 343 days.

(21) Appl. No.: 12/443,110

(22) PCT Filed: Sep. 24, 2007

(86) PCT No.: PCT/EP2007/060124
§ 371 (c)(1),
(2), (4) Date: Aug. 28, 2009

(87) PCT Pub. No.: WO2008/040657
PCT Pub. Date: Apr. 10, 2008

(65) Prior Publication Data
US 2010/0084253 A1    Apr. 8, 2010

(30) Foreign Application Priority Data
Sep. 29, 2006   (DE) .................. 10 2006 046 202

(51) Int. Cl.
*H01H 9/00* (2006.01)
(52) U.S. Cl. ........................................ 200/310
(58) Field of Classification Search .............. 200/310, 200/5 R, 52 R, 4, 11 R, 305; 324/661
See application file for complete search history.

(56) References Cited

U.S. PATENT DOCUMENTS

| | | | |
|---|---|---|---|
| 6,610,937 B2 | 8/2003 | Yamaguchi | |
| 7,046,230 B2 | 5/2006 | Zadesky et al. | |
| 7,795,553 B2* | 9/2010 | Weber et al. | 200/341 |
| 7,889,176 B2* | 2/2011 | Harley et al. | 345/157 |
| 7,910,843 B2* | 3/2011 | Rothkopf et al. | 200/5 R |
| 2002/0190727 A1 | 12/2002 | Morimoto | |
| 2004/0253931 A1 | 12/2004 | Bonnelykke et al. | |
| 2005/0259085 A1 | 11/2005 | Baker et al. | |

FOREIGN PATENT DOCUMENTS

| | | |
|---|---|---|
| DE | 10308514 A1 | 9/2004 |
| DE | 102004048463 A1 | 5/2005 |
| DE | 212004000044 U1 | 6/2006 |
| EP | 1589407 A1 | 10/2005 |
| GB | 2050621 A | 1/1981 |
| WO | WO 9420928 A1 | 9/1994 |
| WO | WO 2005076117 A1 | 8/2005 |

* cited by examiner

*Primary Examiner* — Edwin A. Leon

(57) ABSTRACT

The invention relates to an input unit for electrotechnical devices, the unit being configured such that it is technically particularly effective, yet still cost-effective. Further, it is the aim to also provide illumination elements at little expense. For touching by finger, such an input unit comprises a cover suitable for capacitive field transmissions, the cover having a contact region that can be used for touching more than a single location. A sensor film is disposed directly beneath the cover, wherein the film has a resistance structure on the side facing the cover, the structure being electrically contacted via three contact points. The resistance structure is configured such that it continually, or at least quasi continually, capacitively responds as a function of the current location of touch of the cover by a human finger and sets a corresponding resistance variable, which can be tapped at the three contact points and used to generate a respectively associated input signal for the electrotechnical device for the corresponding control thereof.

12 Claims, 3 Drawing Sheets

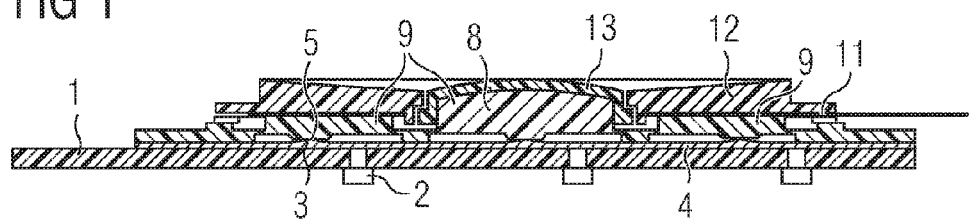
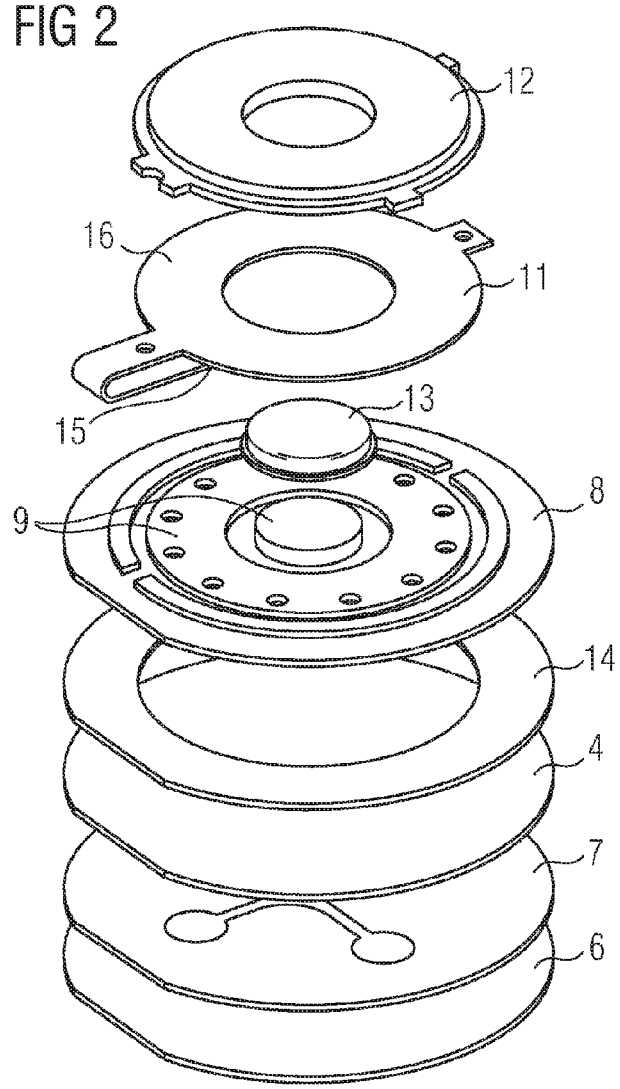

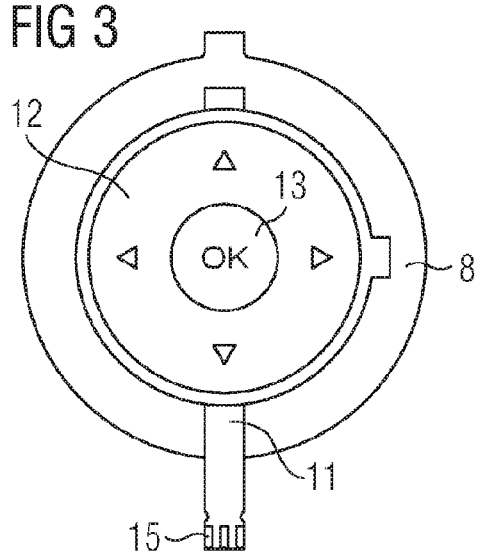
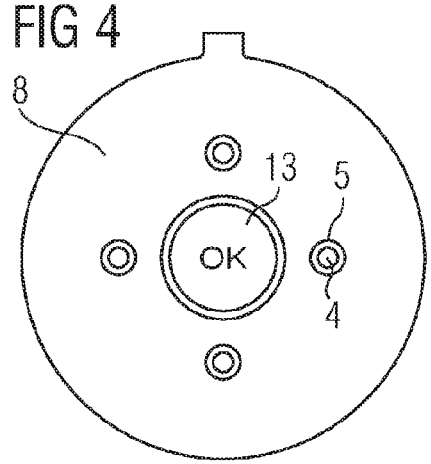
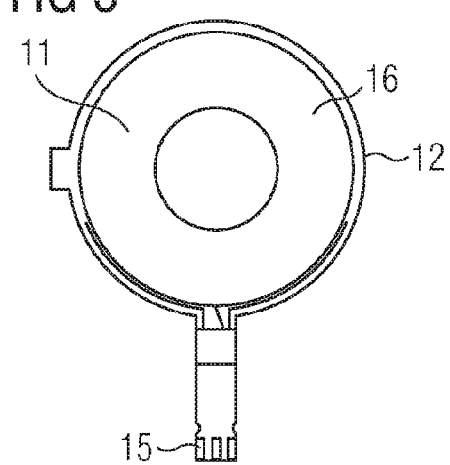

INPUT UNIT FOR ELECTROTECHNICAL DEVICES

CROSS-REFERENCE TO RELATED APPLICATIONS

This application is the United States national stage under 35 U.S.C. §371 of International Application No. WO2008/040657, filed on Sep. 24, 2007, claiming priority to German Application No. 10 2006 046 202.5, filed on Sep. 29, 2006. Both of those applications are incorporated by reference herein.

BACKGROUND OF THE INVENTION

1. Field of the Invention

The invention relates to an input unit for electrotechnical devices.

2. Background of the Art

Input units for electrotechnical devices serve to input data information into an electrotechnical device or to trigger a desired function in it. Ultimately, such input units control input signals for the electrotechnical device, which correspond to a particular requirement and as a function of it, the electrotechnical device then carries out its task.

Generally, input units are known that have components operable with the human finger to electromechanically and/or electronically generate such input signals, with which a corresponding controlled actuation of the electrotechnical device is performed.

BRIEF SUMMARY OF THE INVENTION

The object of the present invention is, based upon an input device of the type as mentioned above, to construct it in such a manner that it is in particular technically effective and still cost-efficient, and that the provision of lighting elements is possible without all too much complexity.

There is provided for the finger contact of the input unit a cover suited for capacitive field movement that has a contact area that can be used for contacting at more than a single location. Directly underneath the cover is arranged a sensor film that has on the side facing the cover a resistance structure that can be electrically contacted via three contact points. The resistance structure is constructed in such a manner that it responds continuously or at least quasi-continuously capacitively as a function of the momentary position of the contact on the cover by the human finger and sets a respective corresponding resistivity that can be measured at the three contact points and can be used to generate a respectively associated input signal for the electrotechnical device for the respective corresponding control thereof.

Such an input unit is particularly effective because the resistance structure controlling the action is arranged as close as possible to the cover surface and a finger contact of the cover surface exerts a direct technical influence on the resistance structure of the sensor film.

Furthermore, such an input unit is cost-effective because such a sensor film is manufactured in a particularly simple manner and is therefore inexpensive.

Lastly, lighting elements can be taken into consideration. On the one hand, it is possible to arrange lighting elements with a corresponding connection capability directly on the sensor film. On the other, it is possible to provide lighting elements for example underneath the cover area of the sensor film and to design the sensor film in a perforated manner for example at the relevant locations for the passage of light to illuminate the cover surface at desired locations.

The input unit thus comprises in any case a touch key that can also be illuminated if applicable.

The sensor film can be glued in with double-sided adhesive film for example. It can be contacted with a corresponding plug, for example an actually common ZIF or board-to-board plug, with an existing circuit board, for example a base circuit board.

By means of the special resistance structure on the sensor film, the finger position on the cover can be determined in a capacitive manner. In doing so, the resistance is measured at three locations. Each of these three locations is led via a conductor to an associated contact point. By means of the already mentioned corresponding plug, these conductors are led to the pertinent circuit board. On this circuit board are located electronics, for example in the form of a special sensor chip with associated control hardware and software. These electronics control and detect the signals that are generated with the finger contact on the cover, and convert these signals into corresponding responses made by the underlying electrical device. For example, by means of it a cursor can be controlled in a display indicator or one can jump from one menu into another within a running program.

Advantageous embodiments of the invention are the subject matter of the sub-claims.

Accordingly, the cover can be formed by a hard cap. It can be constructed separately from other components. For example, it can be manufactured of a material more favorable for capacitive field movement as an additional housing into which the input unit is built. It can be interchangeable in order to be able to also execute various design variants later if applicable.

For inputs using the finger, the contact area of the cover can be constructed in a linear manner. In this way, input that corresponds to a linear slider can be controlled for example by displacing the finger on the contact area. Combined with lighting elements, the then current position of the slider can be visually displayed reactively on the contact area.

Besides such a linear construction of the input unit, other curve-shaped or circular ring-shaped constructions are also executable however.

The curve-shaped construction may be selected for example for design reasons.

The circular ring-shaped construction may be selected for example for reasons of replicating a rotary knob.

The latter in particular has the advantage that without removing the finger from the contact area, a once-initiated input can be sustained continually for longer periods of time. Continued sustainment of the input is easily detected by the correspondingly designed software that then ensures that the once-initiated response is also continually carried on until finally the finger is at least briefly removed from the contact surface.

The electronics to analyze the input by means of the input unit according to the invention is arranged for example on a rigid base circuit board. It can simultaneously be used to also place the input unit on it. Thus, all in all, only one single rigid circuit board is required as a mount.

The sensor film can be of so-called PET film (polyethylene terephthalate film; film made of a thermoplastic synthetic from the polyester family). It can for example also be a FPC (flexible printed circuit; film that corresponds to a flexible circuit board) film. Both films are not transparent so that with an additional use of lighting sources, these are to be mounted on these films for example.

The resistance structure on the sensor films can be a carbon or silver print that can be applied very easily. However, other construction possibilities are also conceivable.

If lighting sources are used in connection with the input unit, the cover is constructed transparent at least only at the locations required therefor. The construction of such locations is not a problem technically. The electrical connection and the corresponding controlled switching of these lighting sources is also not a problem technically.

In a particular embodiment of the invention, there is between the sensor film and the circuit board underneath the sensor film a key pad, and underneath the key pad there is arranged a metal dome or poly dome film. The respective domes of the metal dome or poly dome films are each assigned to an electrical contact on the rigid circuit board, for example the base circuit board mentioned above. Accordingly, these respective domes are each mechanically actuatable via the cover and specifically in such a manner that by activating such a dome via the corresponding location on the cover or contact surface, initiated by a corresponding finger pressure, the respectively assigned electrical contact on the circuit board or base circuit board is activated.

This is possible because the thin cover providing the contact surface is flexible. The key pad is also flexible. It is manufactured out of a silicone material. In addition, the domes of the metal dome or poly dome film are also flexible because their task is precisely to buckle under pressure and execute an electrical contact.

In this way it is possible to also enable mechanical actuations using the input unit according to the invention. For their execution, a conventional assembly can ultimately be used consisting basically of a flexible key pad, if necessary fitted with hard caps on the respective pad points, and an actuation film, that is a metal dome or a poly dome film. In certain circumstances, a clearance film, also known as a spacer film, is placed under the metal dome or poly dome film.

In another advantageous embodiment of the invention, the sensor film is a transparent ITO (indium tin oxide) film. Furthermore, the cover is constructed transparently at least in selected locations. On the rigid circuit board or base circuit board, there are arranged at selected locations switchable light-emitting diodes that can be switched by means of the electronics on the pertinent circuit board. Between the sensor film and said circuit board, there is arranged underneath the sensor film a transparent key pad and under the key pad a metal dome or poly dome film. The respective domes of the metal dome or poly dome film are each assigned to an electrical contact on the circuit board. Furthermore, these respective domes are each mechanically actuatable with the finger via the cover by means of pressure on the cover at a pertinent location in such a manner that when activating such a dome, the respectively assigned electrical contact on said circuit board is activated. In the metal dome or poly dome film, there are provided recesses that are assigned to the respective light-emitting diodes on said circuit board in such a manner that an illumination, via the light-emitting diodes, of selected transparent locations of the cover is ensured through the transparent key pad and the transparent ITO film.

All in all, an input unit is thereby once again provided that functions sensor-mechanically and if applicable with lighting. Furthermore, the lighting does not require a populated sensor circuit board, which is thus substantially simplified and therefore very inexpensive. By omitting the key illumination, an unpopulated printed PET film can also be used.

The resistance structure on the sensor film can be constructed with populated resistors or with printed resistors.

For a circular ring-shaped input unit, circular motions executed with the finger on the contact area can be detected.

In addition, on such an input device, a mechanically actuatable pressure switch may be arranged in the center of the contact area constructed in a circular ring-shaped manner.

To detect the position of the finger on the contact area, the resistance structure is subdivided into a plurality of individual areas that each correspond to absolute positions. A given current resistivity belonging to a current finger contact is thereby detected in relation to the resistivity of a corresponding absolute first and a corresponding last position. In other words, the resistance structure functions almost like an adjustable potentiometer, yet with capacitive variables. The given current adjusted value is measured. Based on the current value, the position of a cursor is then controlled for example.

The input unit according to the invention can then be installed in a particularly advantageous manner in a telephone, which has the functionalities of a computer and also has a display among other things upon which an information display is located corresponding to such a computer.

Hereinafter, an embodiment of the invention will be explained in more detail by means of a drawing.

BRIEF DESCRIPTION OF THE FIGURES

FIG. 1 depicts a cross-section through an input unit according to the invention.

FIG. 2 depicts a three-dimensional exploded view of the most critical parts of the input unit according to FIG. 1.

FIG. 3 depicts a top, three-dimensional view on to the parts according to FIG. 2 in an assembled state.

FIG. 4 depicts a three-dimensional top view of the parts according to FIG. 3 with the cover and sensor film removed.

FIG. 5 depicts a bottom view of the sensor film and cover removed in FIG. 4

DETAILED DESCRIPTION OF THE INVENTION

Figure 6:
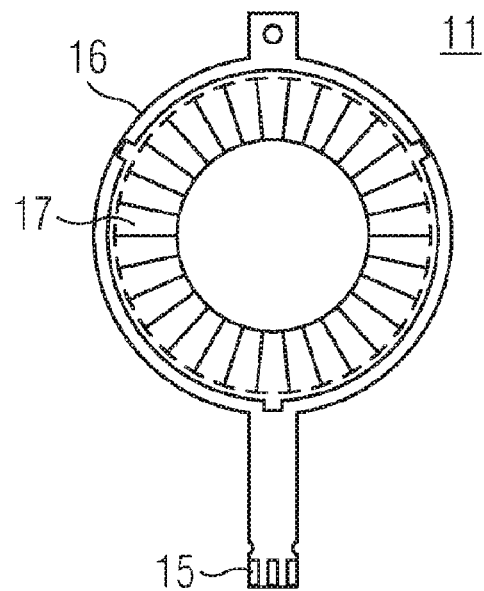
FIG. 6 depicts an initial embodiment of a sensor film as it can be used in FIG. 1, 2, 3 or 5.

In FIG. 1, one can see a rigid circuit board or base circuit board 1 upon whose undersurface lighting elements in the form of light-emitting diodes 2 are arranged. The light-emitting diodes 2 are fitted on to the undersurface of said circuit board 1 and electrically connected and project through an opening in said circuit board 1 in such a manner that the light-emitting diodes 2 can shine their light above said circuit board 1.

On the circuit board 1, there is arranged in addition to the elements described in greater detail hereafter at least also electronics comprising hardware and software that allow one to analyze input signals generated by the input unit mounted on the circuit board 1 and to implement in corresponding responses, such as a corresponding cursor control on a display or a corresponding function execution.

The circuit board 1 has electrical contacts 3 on the top side. Above the area of the electrical contacts 3 is arranged a metal dome or poly dome film 4 with respective domes 5. The individual domes 5 of the metal dome or poly dome film 4 are each assigned to the electrical contacts 3 on the circuit board 1 so that when actuating dome 5, an electrical contact 3 on the circuit board 1 is closed.

Between the metal dome or poly dome film 4 and the circuit board, a separating film 6 and a spacer film 7 (FIG. 2) may be arranged, which however is not further labeled in FIG. 1.

Above the metal dome or poly dome film 4, there is arranged a key pad 8 consisting of silicone with pressure bodies and tappets 10 associated with each for the actuation of a respective dome 5 of the metal dome or poly dome film 4.

The structure with the electrical contacts 3 on the circuit board 1, the metal dome or poly dome film 4, the separating film 6 and the spacer film 7 (so-called spacer film), if present, and the key pad 8 is constructed in a circular ring-shaped manner. In doing so, there is also assigned to the center of the circular ring-shaped structure an electrical contact 3 on the circuit board 1, a dome 5 of the metal dome or poly dome film 4, and a pressure housing 9 of the key pad 8 with the associated tappet 10.

On the circular ring-shaped key pad 8 is arranged a corresponding circular ring-shaped sensor film 11.

On the circular ring-shaped sensor film 11 is arranged a corresponding circular ring-shaped cover 12 that, in the present embodiment, is a circular ring-shaped hard cap.

In the center of the circular ring-shaped structure, a hard cap 13 is arranged on a pressure housing 9 of the key pad 8.

Between the key pad 8 and the metal dome or poly dome film 4, a double-sided adhesive film 14 (FIG. 2) may be arranged that is also not further labeled in FIG. 1.

So that the lighting effected by the light-emitting diodes 2 can be effective, the metal dome or poly dome film 4 has, on the corresponding locations, openings that can be executed for example by punched holes.

Furthermore, the key pad 8 and the sensor film 11 are constructed to be transparent. Lastly, at least those locations of the circular ring-shaped hard cap 12 are constructed to be transparent, at which a pressure actuation on an electrical contact 3 on the circuit board 1 is to be visually indicated.

To the extent that a separating film 6, a spacer film 7, or an adhesive film 14 are used, these films are either constructed to be transparent or have a corresponding opening for the passage of light of the pertinent light-emitting diode 2 at the pertinent locations.

FIG. 2 depicts in detail and in the order indicated from top to bottom: a circular ring-shaped hard cap 12, a circular ring-shaped sensor film 11 with contact points 15 for an electrical contacting of the resistance structure 16 arranged on the sensor film 11, a key pad 8 with a hard cap 13 for the pressure housing 9 arranged in the center, an adhesive film 14, a metal dome or poly dome film 4, a spacer film 7, and a separating film 6.

In FIG. 3, the hard cap 12 in particular can be identified, underneath which the sensor film 11 is arranged. Furthermore, the contact points 15 of the sensor film 11 are indicated. Underneath the sensor film 11 is arranged the key pad 8. In the center of the circular ring-shaped hard cap 12 is arranged the additional hard cap 13.

In FIG. 4, one can see arranged in the center the hard cap 13 that is positioned in the center on the key pad 8. The metal dome or poly dome film 4 with the domes 5 is arranged underneath the key pad 8. In the present embodiment, the metal dome or poly dome film 4 is constructed in such a scaled back manner that practically only the domes 5 are connected to each other. In this way, it is no longer necessary, where applicable, to provide additional openings for the passage of light for the light-emitting diodes 2.

In FIG. 5, one can see the sensor film 11, upon whose underside the resistance structure 16 is arranged on the one hand and shines through the transparent sensor film 11, and on which the circular ring-shaped hard cap 12 is arranged on the other. The contact points 15 of the sensor film 11 can be seen on a tongue-like extension of the sensor film 11.

Figure 7:
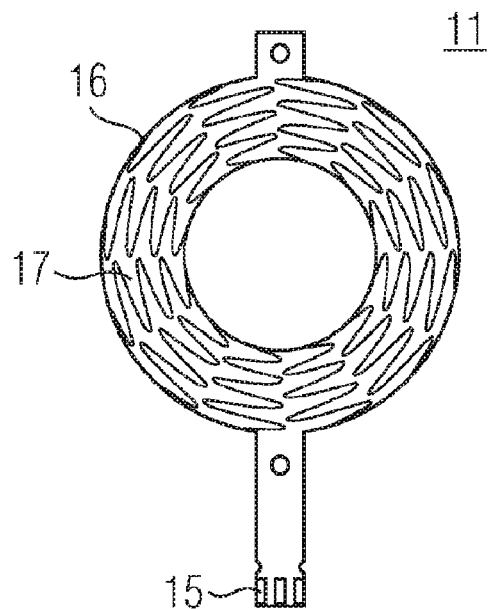
FIG. 7 depicts a second embodiment of a sensor film as it can be used in FIG. 1, 2, 3 or 5.

In FIGS. 6 and 7, one can see an embodiment in each of a sensor film 11 with the contact points 15 and a respective resistance structure 16.

In FIG. 6, the resistance structure 16 has individual areas 17 arranged next to each other in a circle that are all interlinked electrically and are electrically connected to one of the contact points 15. The individual areas 17 each represent a corresponding absolute position. Furthermore, an absolute first position of the resistance structure is electrically connected to one of the other contact points 15.

Lastly, an absolute last position of the resistance structure 16 is connected to one of the other contact points 15. The respective absolute positions and the individual areas 17 are electro-physically connected to each other in such a manner that capacitive resistances can be measured at the contact points 15.

What applies to FIG. 6 applies correspondingly for FIG. 7, however with a resistance structure 16 that has areas engaging into each other in a finger-like manner and are not a carbon print as in FIG. 6 but of a metallic execution.

The invention claimed is:

1. An input unit for electrotechnical devices, having components operable with a human finger for electromechanical and/or electronic generation of input signals for a controlled actuation of an electrotechnical device based on these generated input signals, comprising:
    a rigid circuit board;
    a cover suited for capacitive field movement, said cover mounted on said circuit board, said cover transparent in at least selected locations, said cover comprising a contact surface for contact at more than one single location;
    a sensor film, wherein said sensor film is a transparent ITO film directly beneath said cover, said sensor film comprising a resistance structure that is contactable via three contact points and that responds in a continually capacitive manner as a function of a then current location of a contact of the cover by a human finger and that sets a respective corresponding resistivity that is measurable at the three contact points, wherein said resistivity can be used to generate a respectively associated input signal for the electrotechnical device for its respective corresponding actuation;
    switchable light-emitting diodes arranged on the circuit board in selected locations in a switchable manner by means of electronics on the circuit board;
    a transparent key pad located between the sensor film and the circuit board and under the sensor film; and
    a metal dome or poly dome film under said keypad, wherein the dome is assigned to an electrical contact on the circuit board and the dome is mechanically actuatable via the cover in such a manner that when actuating the dome the respectively assigned electrical contact on the circuit board is actuated, and that in the metal dome or poly dome film there are provided recesses that are assigned to the respective light-emitting diodes on the circuit board in such a manner that illumination by the light-emitting diodes of selected transparent locations of the cover is ensured through the transparent key pad and the transparent sensor film.

2. An input unit for electrotechnical devices, having components operable with a human finger for electromechanical and/or electronic generation of input signals for a controlled actuation of electrotechnical device based on these generated input signals, comprising:

a rigid circuit board;
a cover suited for capacitive field movement, said cover mounted on said circuit board, said cover transparent in at least selected locations, said cover comprising a contact surface for contact at more than one single location;
a sensor film, wherein said sensor film is directly beneath said cover and is a PET film that is perforated in corresponding locations for a passage of light to illuminate the cover at predetermined locations, said sensor film comprising a resistance structure that is contactable via three contact points and that responds in a continually capacitive manner as a function of a then current location of a contact of the cover the a human finger and that sets a respective corresponding resistivity that is measurable at the three contact points, wherein said resistivity can be used to generate a respectively associated input signal for the electrotechnical device for its respective corresponding actuation;
switchable light-emitting diodes arranged on the circuit board in selected locations in a switchable manner by means of electronics on the circuit board;
a transparent key pad located between the sensor film and the circuit board and under the sensor film; and
a metal dome or poly dome film under said keypad, wherein the dome is assigned to an electrical contact on the circuit board and the dome is mechanically actuatable via the cover in such a manner that when actuating the dome the respectively assigned electrical contact on the circuit board is actuated, and that in the metal dome or poly dome film, there are provided recesses that are assigned to the respective light-emitting diodes on the circuit board in such a manner that illumination by the light-emitting diodes of selected transparent locations of the cover is ensured through the transparent key pad and the perforated sensor film.

3. An input unit for electrotechnical devices, having components operable with a human finger for electromechanical and/or electronic generation of input signals for a controlled actuation of electrotechnical device based on these generated input signals, comprising:
a rigid circuit board;
a cover suited for capacitive field movement, said cover mounted on said circuit board, said cover transparent in at least selected locations, said cover comprising contact surface for contact at more than one single location;
a sensor film, wherein said sensor film is directly beneath said cover and is a FPC film that is perforated in corresponding locations for the passage of light to illuminate the cover at predetermined locations, said sensor film comprising a resistance structure that is contactable via three contact points and that responds in a continually capacitive manner as a function of a then current location of a contact of the cover by a human finger and that sets a respective corresponding resistivity that is measurable at the three contact points, wherein said resistivity can be used to generate a respectively associated input signal for the electrotechnical device for its respective corresponding actuation;
switchable light-emitting diodes arranged on the circuit board in selected locations in a switchable manner by means of electronics on the circuit board;
a transparent key pad located between the sensor film and the circuit board and under the sensor film; and
a metal dome or poly dome film under said keypad, wherein the dome is assigned to an electrical contact on the circuit board and the dome is mechanically actuatable via the cover in such a manner that when actuating the dome the respectively assigned electrical contact on the circuit board is actuated, and that in the metal dome or poly dome film, there are provided recesses that are assigned to the respective light-emitting diodes on the circuit board in such a manner that illumination by the light-emitting diodes of selected transparent locations of the cover is ensured through the transparent key pad and the perforated sensor film.

4. The input unit of claim 1, wherein the cover is a hard cap.

5. The input unit of claim 1, wherein a contact area provided by the cover is constructed to be linear.

6. The input unit of claim 1, wherein a contact area provided by the cover is constructed to be curve-shaped.

7. The input unit of claim 1, wherein a contact area provided by the cover is constructed to be circular ring-shaped.

8. The input unit of claim 1, wherein the circuit board comprises electronics that are connected with the three contact points of the sensor film and by means of which as a function of the resistivities set continually by the sensor film respective corresponding input signals are generated for the electrotechnical device for its respective corresponding actuation.

9. The input unit of claim 1, wherein the resistance structure is a carbon or silver print.

10. The input unit of claim 7, wherein in the center of the contact surface constructed in a circular ring-shape, there is a mechanically actuatable pressure switch.

11. The input unit of claim 1, wherein the resistance structure is subdivided into a plurality of individual areas each corresponding to absolute positions and wherein a current resistivity associated with a current finger contact is generated in relation to the resistivity of a corresponding absolute first and a corresponding absolute last position.

12. A telephone comprising the input unit of claim 1.

* * * * *